US008075721B2

(12) United States Patent
Ji et al.

(10) Patent No.: US 8,075,721 B2
(45) Date of Patent: Dec. 13, 2011

(54) LOW EXOTHERMIC THERMOSETTING RESIN COMPOSITIONS USEFUL AS UNDERFILL SEALANTS AND HAVING REWORKABILITY

(75) Inventors: Qing Ji, El Monte, CA (US); Chew B. Chan, Chino Hills, CA (US); Hwang K. Yun, Irvine, CA (US); Renzhe Zhao, Chino Hills, CA (US); Weitong Shi, Shangdon (CN)

(73) Assignee: Henkel Corporation, Rocky Hill, CT (US)

( * ) Notice: Subject to any disclaimer, the term of this patent is extended or adjusted under 35 U.S.C. 154(b) by 681 days.

(21) Appl. No.: 12/091,094

(22) PCT Filed: Oct. 24, 2006

(86) PCT No.: PCT/US2006/041484
§ 371 (c)(1),
(2), (4) Date: Apr. 22, 2008

(87) PCT Pub. No.: WO2007/050611
PCT Pub. Date: May 3, 2007

(65) Prior Publication Data
US 2008/0285247 A1 Nov. 20, 2008

Related U.S. Application Data

(60) Provisional application No. 60/729,952, filed on Oct. 25, 2005.

(51) Int. Cl.
*B32B 38/10* (2006.01)
*C09J 163/02* (2006.01)
*B32B 27/38* (2006.01)
*C08L 63/02* (2006.01)
*H01L 23/29* (2006.01)

(52) U.S. Cl. ........ 156/247; 156/330; 257/793; 428/413; 428/414; 523/440; 525/523; 525/524

(58) Field of Classification Search .................. 257/788, 257/793; 428/413, 414; 523/440, 443, 451, 523/453, 461, 466; 525/523, 524; 156/94, 156/152, 247, 330
See application file for complete search history.

(56) References Cited

U.S. PATENT DOCUMENTS

| 5,547,713 | A | * | 8/1996 | Alvarado | 427/493 |
| 6,070,427 | A | | 6/2000 | Fine et al. | |
| 6,316,528 | B1 | | 11/2001 | Iida et al. | |
| 6,323,263 | B1 | | 11/2001 | Kuwabawa et al. | |
| 6,372,350 | B1 | * | 4/2002 | Scott et al. | 428/413 |
| 2002/0106515 | A1 | | 8/2002 | Carpenter et al. | |
| 2006/0030682 | A1 | * | 2/2006 | Hurley et al. | 525/485 |
| 2008/0071002 | A1 | * | 3/2008 | Jethmalani et al. | 522/31 |

FOREIGN PATENT DOCUMENTS

JP 2002-284849 A * 10/2002
WO WO 2005/062369 A1 7/2005

OTHER PUBLICATIONS

Abstract of JP 2002-284849 A, provided by the JPO (no date).*
Product Data Sheet for NACURE Super XC-7231 Catalyst, provided by King Industries (no date).*
Definition of "Ammonium Antimonate" (p. 285); Watts' Dictionary of Chemistry, pp. 282-294 (1890).*
International Search Report and the Written Opinion, dated Mar. 30, 2007.

* cited by examiner

*Primary Examiner* — Michael J Feely
(74) *Attorney, Agent, or Firm* — Steven C. Bauman

(57) ABSTRACT

This invention relates to the thermosetting resin compositions useful for mounting onto a circuit board semiconductor devices, such as chip size or chip scale packages ("CSPs"), ball grid arrays ("BGAs"), land grid arrays ("LGAs") and the like, each of which having a semiconductor chip, such as large scale integration ("LSI"), on a carrier substrate. Similarly, the compositions are useful for mounting onto circuit board semiconductor chips themselves. Reaction products of the compositions of this invention are controllably reworkable when subjected to appropriate conditions. And significantly, unlike many commercial rapid curing underfill sealants ("snap cure underfills"), the inventive compositions possess an exotherm under 300 J/g or demonstrate package stability at 55° C. for 7 days, and therefore do not require special packaging to be transported by air courier, or special approval from international transportation authorities, such as the U.S. Department of Transportation, to permit such air transport. The inventive compositions possess an exotherm under 300 J/g and/or demonstrate package stability at 55° C. for 7 days and therefore do not require special packaging to be transported by air courier, or special approval from international transportation authorities, such as the U.S. Department of Transportation, to permit such air transport.

1 Claim, 3 Drawing Sheets

LOW EXOTHERMIC THERMOSETTING RESIN COMPOSITIONS USEFUL AS UNDERFILL SEALANTS AND HAVING REWORKABILITY

BACKGROUND OF THE INVENTION

1. Field of the Invention

This invention relates to thermosetting resin compositions useful for mounting onto a circuit board semiconductor devices, such as chip size or chip scale packages ("CSPs"), ball grid arrays ("BGAs"), land grid arrays ("LGAs") and the like, each of which having a semiconductor chip, such as large scale integration ("LSI"), on a carrier substrate. Similarly, the compositions are useful for mounting onto circuit board semiconductor chips themselves. Reaction products of the compositions of this invention are controllably reworkable when subjected to appropriate conditions. And significantly, unlike many commercial rapidly curing underfill sealants ("snap cure underfills"), the inventive compositions possess an exotherm under 300 J/g or demonstrate package stability at 55° C. for 7 days, and therefore do not require special packaging to be transported by air courier, or special approval from international transportation authorities, such as the U.S. Department of Transportation, to permit such air transport.

2. Brief Description of Related Technology

The popularity of small digital recorders, cellular (or, mobile) telephone sets, portable digital music recorder/players (such as iPod's) and devices combining such features has made size reduction of LSI devices desirable. As a result, CSPs, BGAs and LGAs have been used to reduce the size of packages substantially to that of bare chips. CSPs, BGAs and LGAs improve the characteristics of the electronic device while retaining many of their operating features, thus serving to protect bare semiconductor chips, such as LSIs, and facilitate testing thereof.

Ordinarily, the CSP/BGA/LGA assembly is connected to electrical conductors on a circuit board by use of a solder connection. However, when the resulting CSP/BGA/LGA/circuit board structure is exposed to thermal cycling, vibration, distortion or is dropped, the reliability of the solder-connection between the circuit board and the CSP/BGA/LGA often becomes suspect. After a CSP/BGA/LGA assembly is mounted on a circuit board, the space between the CSP/BGA/LGA assembly and the circuit board is often now filled with a sealing resin (commonly referred to as underfill sealing) in order to relieve stresses caused by thermal cycling, thereby improving heat shock properties and enhancing the reliability of the assembled structure.

However, since thermosetting resin compositions that form cross linked networks when cured are typically used as the underfill sealing material, in the event of a failure after the CSP/BGA/LGA assembly is mounted on the circuit board, it is difficult to replace the CSP/BGA/LGA assembly without destroying or scrapping the CSP/BGA/LGA assembly-circuit board structure in its entirety.

U.S. Pat. No. 6,316,528 (Iida) refers to a thermosetting resin composition capable of sealing underfilling between a semiconductor device including a semiconductor chip mounted on a carrier substrate and a circuit board to which said semiconductor device is electrically connected. The composition includes about 100 parts by weight of an epoxy resin, about 3 to about 60 parts by weight of a curing agent, and about 1 to about 90 parts by weight of a plasticizer. There, the area around the cured thermoset is heated at a temperature of about 190 to about 260° C. for a period of time ranging from about 10 seconds to about 1 minute in order to achieve softening and a loss of much of its adhesiveness.

In addition, certain underfill sealants have been designed to cure rapidly at low temperatures. One of the technical challenges of designing such products is balancing the desired low temperature and rapid cure with shelf stability and low exotherm. Shelf stability is improved by cold storage and transport; however, the exothermic nature of the product is inherent to the product formulation.

International transportation regulatory authorities require reactive formulations to have either an exotherm below a certain value (300 J/g), demonstrate stability over a set period of time at slightly elevated temperatures or be packaged in specially designed packaging to be transported by air, and in some jurisdictions both. As an example of a specially designed packaging, see U.S. Pat. No. 6,070,427.

Clearly, it would be desirable to provide reactive formulations whose exotherms fall below that set value and as a result do not require the specially designed packaging, while providing the physical property profile desired by the end user.

Henkel Corporation introduced a snap cure underfill under Product No. 3593, which is a rapid curing, fast flowing, liquid designed for use as a capillary flow underfill, particularly for CSPs. Product No. 3593 has been well received commercially. However, certain physical properties of Product No. 3593, such as crack resistance and moisture uptake, could stand improvement.

Thus, it would be desirable to provide a thermosetting resin composition useful as an underfill sealant that possesses an exotherm under 300 J/g or demonstrates package stability at 55° C. for 7 days.

Notwithstanding the state-of-the-art, it would be desirable for an underfilling sealing material to be able to be transporting without requiring specially designed packaging in order to comply with international transportation authorities; to flow rapidly by capillary action in the underfill space between for instance the CSP, BGA or LGA and the circuit board; to cure rapidly under low temperature conditions; to provide good productivity and thermal shock resistance, while allowing the substrates with which it is to be used to be readily processed and easily separated from a semiconductor device without too extreme conditions that may compromise the integrity of the semiconductor devices remaining on the substrate or the substrate itself; and to be reworkable in the event of failure of the semiconductor in the CSP, BGA or LGA once assembled onto the circuit board.

SUMMARY OF THE INVENTION

The present invention provides a thermosetting resin composition useful as an underfill sealant resin. The composition enables a semiconductor device, such as a CSP/BGA/LGA assembly which includes a semiconductor chip mounted on a carrier substrate, to be securely connected to a circuit board by short-time heat curing and with good productivity, which demonstrates excellent heat shock properties (or thermal cycle properties), and permits the CSP/BGA/LGA assembly to be easily removed from the circuit board in the event of semiconductor device or connection failure. Similarly, a semiconductor chip may be securely connected to, and if necessary removed from, a circuit board using the inventive compositions.

The inventive compositions also may be transported without requiring specially designed packaging in order to comply with international transportation authorities; flow rapidly by capillary action in the underfill space between for instance the CSP, BGA or LGA and the circuit board; and to cure rapidly under low temperature conditions.

The compositions include an epoxy resin component, an inorganic filler component whose mean particle size distribution is on the nano scale (i.e., within the range of about 1 nm to about 1,000 nm) and a thermal initiator which liberates a cationic catalyst.

Reaction products of these compositions are capable of being controllably reworked through the softening and loss of their adhesiveness, such as by exposure to temperature conditions in excess of those used to cure the composition and/or acidic conditions.

Although the thermosetting resin composition of the present invention is curable at a relatively low temperature in a short period of time, cured reaction products thereof have excellent heat shock properties and, moreover, can be easily split by the application of force under heated conditions. That is, semiconductor devices or semiconductor chips attached to circuit boards by cured reaction products of the thermosetting resin compositions of this invention can be easily removed by heating the reaction product, allowing it to swell with a solvent, or allowing it to swell with a solvent under heated conditions.

By using the thermosetting resin compositions of this invention, semiconductor devices, such as CSP, BGA or LGA assemblies, or semiconductor chips can be securely connected to a circuit board by short-time heat curing and with good productivity, with the resulting mounting structure demonstrating excellent heat shock properties (or thermal cycle properties). Moreover, in the event of failure, the semiconductor device or semiconductor chip can be easily removed. This makes it possible to reuse the circuit board, thereby achieve an improvement in the yield of the production process and reducing production cost.

The benefits and advantages of the present invention will become more readily apparent after a reading the "Detailed Description of the Invention", with reference to the figures.

DETAILED DESCRIPTION OF THE INVENTION

Figure 1:
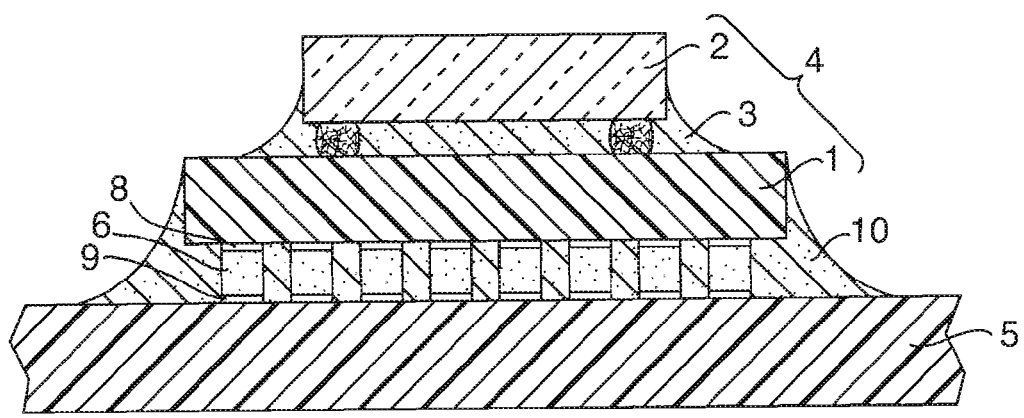
FIG. 1 depicts a cross-sectional view showing an example of a semiconductor device in which the thermosetting resin composition of the present invention is used.

The thermosetting resin composition broadly includes an epoxy resin component, an inorganic filler having a mean particle size distribution in the range of about 1 nm to about 1,000 nm and a thermal initiator that liberates a cationic catalyst.

In addition, the composition may include one or more of a rubber toughening agent, an adhesion promoter, a wetting agent, a colorant, a defoaming agent, and a flowability agent.

In connection with the reworkability aspect of the invention, the temperature used to effect such softening and adhesion loss of compositions within the scope of the present invention may be as great as 50° C. lower than the temperatures required to degrade ordinary epoxy-based compositions used for this purpose, such as those based solely on bisphenol-A-type epoxy resins or bisphenol-F-type epoxy resins as the epoxy resin, which are ordinarily in the vicinity of about 300° C. or more.

For instance the epoxy resin component include the combination of two or more different bisphenol based epoxy resins. These bisphenol based epoxy resins may be selected from bisphenol A, bisphenol F, or bisphenol S epoxy resins, or combinations thereof. In addition, two or more different bisphenol epoxy resins within the same type of resin (such A, F or S) may be used.

Commercially available examples of the bisphenol epoxy resins desirable for use herein include bisphenol-F-type epoxy resins (such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U from Resolution) and bisphenol-A-type epoxy resins (such as YL-979 and 980 from Resolution).

The bisphenol epoxy resins available commercially from Dai Nippon and noted above are promoted as liquid undiluted epichlorohydrin-bisphenol F epoxy resins having much lower viscosities than conventional epoxy resins based on bisphenol A epoxy resins and have physical properties similar to liquid bisphenol A epoxy resins. Bisphenol F epoxy resin has lower viscosity than bisphenol A epoxy resins, all else being the same between the two types of epoxy resins, which affords a lower viscosity and thus a fast flow underfill sealant material. The EEW of these four bisphenol F epoxy resins is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830W, and that for RE1826 as 100 ppm.

The bisphenol epoxy resins available commercially from Resolution and noted above are promoted as low chloride containing liquid epoxy resins. The bisphenol A epoxy resins have a EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxy resins have a EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxy resins, other epoxy compounds are included within the epoxy component of the present invention. For instance, cycloaliphatic epoxy resins, such as 3,4-epoxycyclohexylmethyl-3,4-epoxycyclohexylcarbonate, are used. Also monofunctional, difunctional or multifunctional reactive diluents to adjust the viscosity and/or lower the Tg are also used, such as butyl glycidyl ether, cresyl glycidyl ether, polyethylene glycol glycidyl ether or polypropylene glycol glycidyl ether.

Among the epoxy resins suitable for use herein also include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxy resins include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

Appropriate monofunctional epoxy coreactant diluents for use herein include those that have a viscosity which is lower than that of the epoxy resin component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

In the event such a monofunctional epoxy coreactant diluents is included, such coreactant diluent should be employed in an amount of up to about 5 percent by weight to about 15 percent by weight, such as about 8 percent by weight to about 12 percent by weight, based on the total weight of the composition.

The epoxy resin component should be present in the composition in an amount which the range of about 10 percent by weight to about 95 percent by weight, desirably about 20 percent by weight to about 80 percent by weight, such as about 60 percent by weight As an inorganic filler component, many materials are potentially useful. For instance, the inorganic filler component may often include reinforcing silicas, such as fused silicas, and may be untreated or treated so as to alter the chemical nature of their surface. The inorganic filler component however includes particles having a mean particle size distribution in the 1-1,000 nanometer ("nm") range. A commercially available example of such filler particles is sold under the tradename NANOPOX, such as NANOPOX XP 22, by Hans Chemie, Germany. NANOPOX fillers are monodisperse silica filler dispersions in epoxy resins, at a level of up to about 50 percent by weight. NANOPOX fillers ordinarily are believed to have a particle size of about 5 nm to about 80 nm. And NANOPOX XP 22 is reported to contain 40 weight percent of silica particles having a particle size of about 15 nm in the diglycidyl ether of bisphenol-F epoxy resin.

Hans Chemie also produces materials under the NANOPOX E trade designations. For instance, reports Hans Chemie NANOPOX E-brand products enable the complete impregnation of electronic components which are difficult to seal otherwise and provide a large spectrum of mechanical and thermal properties such as reduced shrinkage and thermal expansion, fracture toughness and modulus. In Table 1 below, Hans Chemie provides information on the four noted NANOPOX E products:

TABLE 1

| Type | $SiO_2$-Content [wt percent] | Base resin | EEW [g/equiv.] | Dyn. viscosity, 25° C. [mPa·s] | Characterization |
|---|---|---|---|---|---|
| NANOPOX E 430 | 40 | DGEBA/DGEBF | 290 | 45,000 | no cristallization |
| NANOPOX E 470 | 40 | DGEBA | 295 | 60,000 | basic type |
| NANOPOX E 500 | 40 | DGEBF | 275 | 20,000 | low viscous |
| NANOPOX E 600 | 40 | EEC[1] | 220 | 4,000 | cycloaliphatic formulations |

[1] 3,4-epoxycyclohexylmethyl-3,4-epoxycyclohexylcarbonate

Hans Chemie reports that important properties can be significantly improved in epoxy formulations by using NANOPOX E-brand products. For instance:

lower viscosity of the formulation in comparison to conventional reinforced fillers no sedimentation increase in the fracture toughness, impact resistance and modulus improved scratch and abrasion resistance reduction of shrinkage and thermal expansion improvement, or at least no negative effect, in numerous desired properties, such as: thermal stability, chemical resistance, glass transition temperature, weathering resistance, dielectric properties.

The combination of NANOPOX E with conventional fillers—such as quartz—enables a reduction in the resin content of the formulation, which means that the total filler content can be increased to previously unattained levels.

The processability remains essentially unchanged in comparison to the respective base resin, NANOPOX E is used in applications where the above improvements to properties desired or necessary, without compromising the processability by an excessive increase in viscosity (known from fumed silica). Application examples are encapsulation materials and coatings. It is important to emphasize the excellent impregnation properties of NANOPOX E due to the small particle size and the absence of agglomerates. This also enables the complete impregnation of electronic components which are difficult to seal otherwise.

Figure 5:
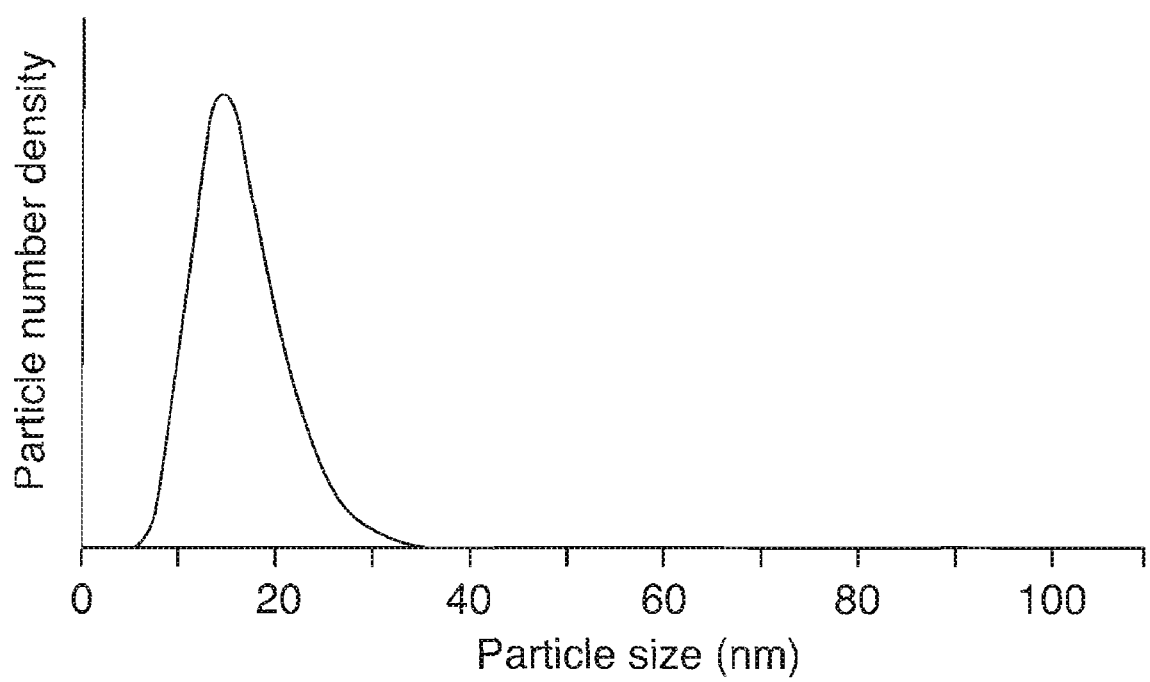
FIG. 5 depicts a particle distribution for NANOPOX E.

According to the manufacturer, NANOPOX E-brand products are a colloidal silica sol in an epoxy resin matrix. The disperse phase consists of surface-modified, spherically shaped SiO2 nanoparticles with diameters below 50 nm and an extremely narrow particle size distribution (see FIG. 5). These spheres, only a few nanometers in size, are distributed agglomerate-free in the resin matrix. This produces a very low viscosity of the dispersion with $SiO_2$ content of up to 40 percent by weight. The nanoparticles are chemically synthesized from aqueous sodium silicate solution. In this unique process the binding agent is not damaged, in contrast to processes in which powdered fillers are dispersed with dissolvers or other equipment using high shear energy.

Other desirable materials for use as the inorganic filler component include those constructed of or containing aluminum oxide, silicon nitride, aluminum nitride, silica-coated aluminum nitride, boron nitride and combinations thereof, provided of course particles having a mean particle size distribution in the 1-1,000 nm range.

The inorganic filler component should be used in an amount of about 10 to about 80 percent by weight of the composition, such as about 12 to about 60 percent by weight, desirably within the range of about 15 to about 35 percent by weight.

As the thermal initiator that liberates a cationic catalyst, many different materials can be used depending upon the temperature at which cure is desired to occur. For instance to achieve cure at a temperature of about 120° C., an appropriate thermal initiator is ammonium antimonite. For a temperature in the about 150° C. to about 180° C. range, a variety of other materials may be used.

The cationic catalyst should be present in an amount with the range of about 0.05 percent by weight to about 10 percent by weight, desirably about 0.1 percent by weight to about 5 percent by weight, such as about 1 percent by weight of the total composition.

In addition, adhesion promoters, such as the silanes, glycidyl trimethoxysilane (commercially available from OSI under the trade designation A-187) or gamma-amino propyl triethoxysilane (commercially available from OSI under the trade designation A-1100), may be used.

Conventional additives may also be used in the compositions of the present invention to achieve certain desired physical properties of the composition, the cured reaction product, or both.

The thermosetting resin compositions according to the present invention are capable of penetrating into the space between the circuit board and the semiconductor device. These inventive compositions also demonstrate a reduced viscosity, at least under elevated temperature conditions, and thus are capable of penetrating into that space. It is desirable to prepare the thermosetting resin composition by selecting the types and proportions of various ingredients to reach a viscosity at 25° C. of 5,000 mPa·s or less, such as 300-2,000 mPa·s, so as to improve its ability to penetrate into the space (e.g., of 10 to 500 μm) between the circuit board and the semiconductor device.

Reference to FIG. 1 shows an example of a semiconductor device mounting structure, such as a CSP, in which the thermosetting resin composition of the present invention is used.

The semiconductor device 4 is one formed by connecting a semiconductor chip (so-called bare chip) 2, such as LSI, to a carrier substrate 1 and sealing the space therebetween suitably with resin 3. This semiconductor device is mounted at a predetermined position of the circuit board 5, and electrodes 8 and 9 are electrically connected by a suitable connection means such as solder 6. In order to improve reliability, the space between carrier substrate 1 and circuit board 5 is sealed with the cured product 10 of a thermosetting resin composition. The cured product 10 of the thermosetting resin composition need not completely fill the space between carrier substrate 1 and circuit board 5, but may fill it to such an extent as to relieve stresses caused by thermal cycling.

Carrier substrates may be constructed from ceramic substrates made of $Al_2O_3$, $SiN_3$ and mullite ($Al_2O_3$—$SiO_2$); substrates or tapes made of heat-resistant resins such as polyimides; glass-reinforced epoxy, ABS and phenolic substrates which are also used commonly as circuit boards; and the like.

Figure 3:
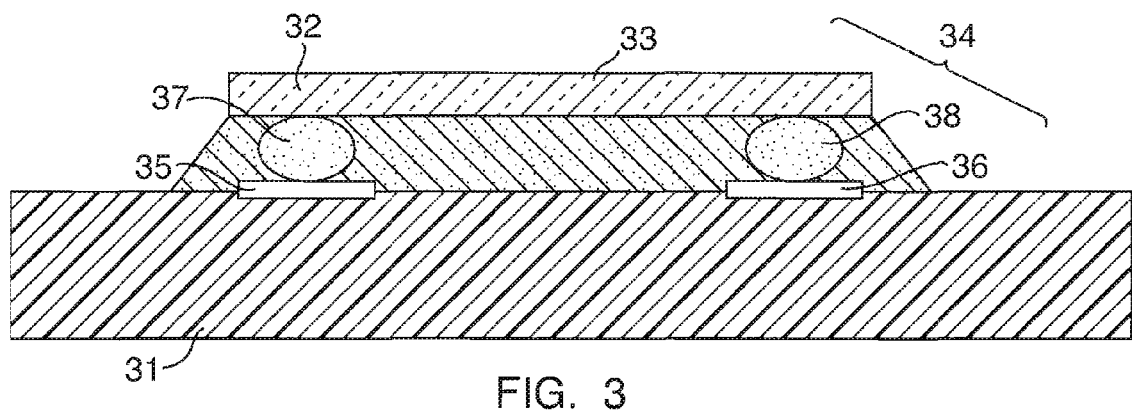
FIG. 3 depicts a cross-sectional view showing an example of a semiconductor flip chip assembly in which the thermosetting resin composition of the present invention is used.

As regards flip chip assemblies, reference to FIG. 3 shows a flip chip assembly in which a semiconductor chip has been mounted onto a circuit board, and the underfilling sealed with a thermosetting resin composition of the present invention.

The flip chip assembly 34 is formed by connecting a semiconductor chip (a bare chip) 32 to a circuit board 31 and sealing the space therebetween suitably with a thermosetting resin composition 33. This semiconductor device is mounted at a predetermined position on the circuit board 31 and electrodes 35 and 36 are electrically connected by a suitable electrical connection means 37 and 38, such as solder. In order to improve reliability, the space between the semiconductor chip 32 and the circuit board 31 is sealed with a thermosetting resin composition 33 and then cured. The cured product of the thermosetting resin composition should completely fill that space.

No particular limitation is placed on the means for electrically connecting the semiconductor chip to the carrier substrate, and there may be employed connection by a high-melting solder or electrically (or anisotropically) conductive adhesive, wire bonding, and the like. In order to facilitate connections, the electrodes may be formed as bumps. Moreover, in order to improve the reliability and durability of connections, the space between the semiconductor chip and the carrier substrate may be sealed with a suitable resin. The semiconductor devices that can be used in the present invention include CSPs, BGAs, and LGAs.

No particular limitation is placed on the type of circuit board used in the present invention, and there may be used any of various common circuit boards such as glass-reinforced epoxy, ABS and phenolic boards.

Next, the mounting process is described below. Initially, cream solder is printed at the necessary positions of a circuit board and suitably dried to expel the solvent. Then, a semiconductor device is mounted in conformity with the pattern on the circuit board. This circuit board is passed through a reflowing furnace to melt the solder and thereby solder the semiconductor device. The electrical connection between the semiconductor device and the circuit board is not limited to the use of cream solder, but may be made by use of solder balls. Alternatively, this connection may also be made through an electrically conductive adhesive or an anisotropically conductive adhesive, Moreover, cream solder or the like may be applied or formed on either the circuit board or the semiconductor device. In order to facilitate subsequent repairs, the solder, electrically or anisotropically conductive adhesive used should, be chosen bearing in mind its melting point, bond strength and the like.

After the semiconductor device is electrically connected to the circuit board in this manner, the resulting structure should ordinarily be subjected to a continuity test or the like. After passing such test, the semiconductor device may be fixed thereto with a resin composition, In this way, in the event of a failure, it is easier to remove the semiconductor device before fixing it with the resin composition.

Then, using a suitable application means such as dispenser, a thermosetting resin composition is applied to the periphery of the semiconductor device. When this composition is applied to the semiconductor device, it penetrates into the space between the circuit board and the carrier substrate of the semiconductor device by capillary action.

Next, the thermosetting resin composition is cured by the application of heat. During the early stage of this heating, the thermosetting resin composition shows a significant reduction in viscosity and hence an increase in fluidity, so that it more easily penetrates into the space between the circuit board and the semiconductor device. Moreover, by providing the circuit board with suitable venting holes, the thermosetting resin composition is allowed to penetrate fully into the entire space between the circuit board and the semiconductor device.

The amount of thermosetting resin composition applied should be suitably adjusted so as to fill the space between the circuit board and the semiconductor device almost completely.

When the above-described thermosetting resin composition is used, it is usually cured by heating at a temperature of about 80° C. to about 150° C. for a period of time of about 5 to about 60 minutes, such as about 120° C. for a period of time of about 30 minutes. Thus, the present invention can employ relatively low-temperature and short-time curing conditions and hence achieve very good productivity. The semiconductor device mounting structure illustrated in FIG. 1 is completed in this manner.

In the mounting process using the thermosetting resin composition of the present invention, after the semiconductor device is mounted on the circuit board as described above, the resulting structure is tested with respect to characteristics of the semiconductor device, connection between the semiconductor device and the circuit board, other electrical characteristics, and the state of sealing. In the event a failure is found, repair can be made in the following manner.

The area around the semiconductor device that has failed is heated at a temperature of about 190° C. to about 290° C. for a period of time ranging from about 10 seconds to about 60 seconds, such as about 285° C. for 30 seconds. Although no particular limitation is placed on the heating means, local heating is preferred. There may be employed a relatively simple means such as the application of hot air to the failure site.

As soon as the solder is melted and the resin is softened to cause a reduction in bond strength, the semiconductor device is pulled apart.

Figure 2:
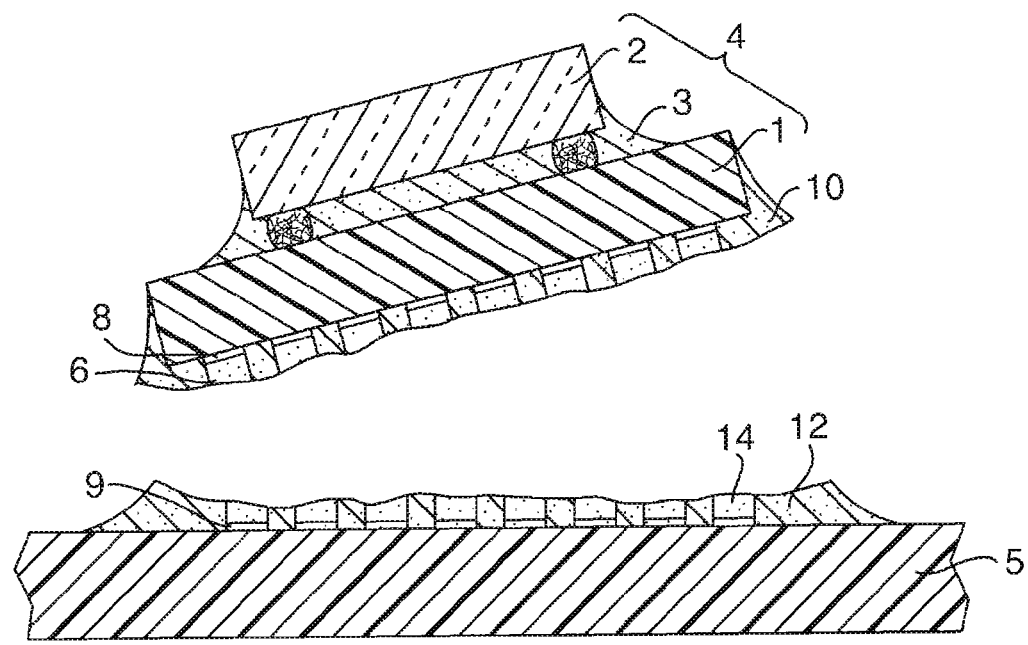
FIG. 2 depicts a cross-sectional view of a semiconductor device which has been removed from the circuit board for repairing purposes.

After the semiconductor device 4 is removed as shown in FIG. 2, a residue 12 of the cured reaction product of the thermosetting resin composition and a residue 14 of the solder are left on the circuit board 5. The residue of the cured product of the thermosetting resin composition can be removed, for example, by scraping it off after the residue has been softened by heating it to a predetermined temperature, allowing it to swell with solvent, or allowing it to swell with solvent while heating it to a predetermined temperature.

Figure 4:
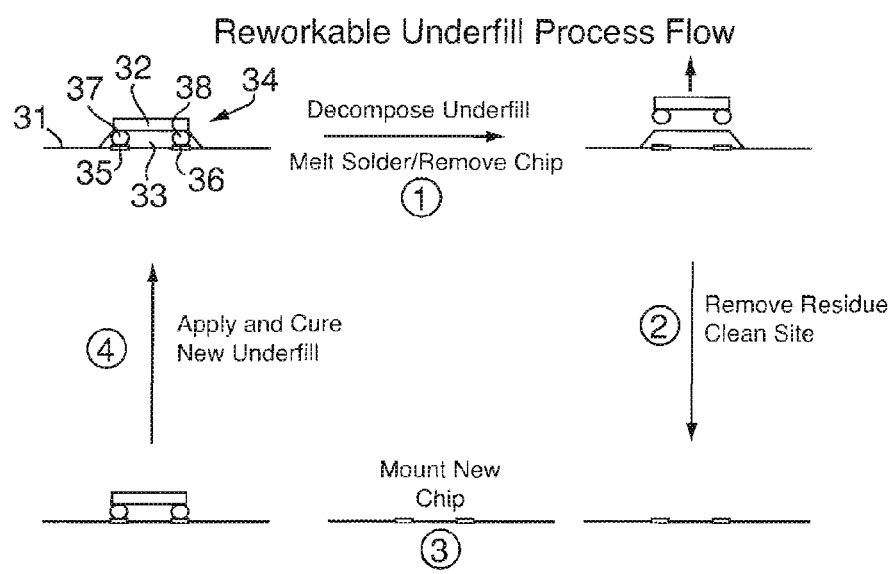
FIG. 4 depicts a flow diagram of a procedure useful to rework a cured thermosetting resin composition in accordance with the present invention, so as to remove a semiconductor device from a circuit board to which it had been attached.

The residue can be most easily removed by using both heating and solvent. For example, the residue can be scraped off after it has been softened by allowing the residual resin to swell with solvent while keeping the entire circuit board at a temperature of about 100° C. (usually in the range of about 80° C. to about 120° C.). (See FIG. 4.)

The solvent used for this purpose is one which causes cured reaction products of the thermosetting resin composition to swell, thereby reducing bond strength to such an extent that the cured material can be scraped off from the circuit board. Useful solvents include organic ones, for example, alkyl chlorides, such as methylene chloride; glycol ethers, such as ethyl cellulose and butyl cellulose; diesters of dibasic, acids, such as diethyl succinate; and N-methylpyrrolidone. Of course, appropriate combinations may also be employed.

Where a circuit-protecting resist has already been connected to the circuit board, the chosen solvents should cause no damage to the resist. Desirable solvents with this in mind include glycol ethers and N-methylpyrrolidone.

The residue of the solder can be removed, for example, by use of a solder-absorbing braided wire.

Finally, on the circuit board which has been cleaned according to the above-described procedure, a new semiconductor device may be mounted again in the same manner as described previously. Thus, the repair of the failure site is completed.

Where a failure is found in the circuit board, the semiconductor device can be reused by removing the residue 12 of the cured reaction product of the thermosetting resin composition and the residue 14 of the solder left on the bottom of the semiconductor device in the same manner as described above. (See FIG. 2.)

The invention will be further illustrated by the following non-limiting examples.

EXAMPLES

Example 1

Thermosetting Resin Composition

A thermosetting resin compositions in accordance with the present invention may be prepared from the components as noted below in Table 1.

TABLE 1

| Component | | Sample No./Amt. (weight · percent) |
|---|---|---|
| Type | Identity | 1 |
| Epoxy | Bisphenol F epoxy resin[1] | 18 |
| | Bisphenol F epoxy resin[2] | 15 |
| | PPG-GE[3] | 15 |
| | ECC[4] | 27 |
| Nanosilica | NANOPOX E-600 | 18 |
| Cationic catalyst | Ammonia Antimonate | 1 |
| Rubber Toughener | ABS[5] | 5 |
| Wetting Agent | Ethyl acrylate-2-ethylhexyl acrylate copolymer | <1 |
| Adhesion Promoter | γ-Glycidoxpropyltrimethoxy-silane | <1 |

[1]RE1801 from Dai Nippon Ink & Chemicals
[2]RSL 1738 from Resolution
[3]Polypropylene glycol glycidyl ether
[4]3,4-epoxycyclohexylmethyl-3,4-epoxycyclohexylcarbonate
[5]Acrylonitrile-Butadiene-Styrene Copolymer Physical Properties In the uncured state, the composition was dispensed from a syringe onto an 8×8 mm CSP at a dispensing temperature of about 75° C. The composition flowed by capillary action into underfill space between the package and a circuit board to which the package was attached in less than 30 seconds.

While the composition was used upon formation, it is expected that the composition may be stored for a period of time of up to about 3 to about 6 months at a temperature of about 5° C. without experiencing any appreciable viscosity increase. This is significant since conventional commercially available snap cure underfill sealant materials are ordinarily required to be stored at a temperature of about −40° C. to achieve that level of storage stability.

The exotherm of this composition was determined by placing a portion of the composition in an aluminum pan, and analyzing the heat of reaction (or, enthalpy) differential scanning calorimetry ("DSC"). The enthalpy was determined to be about 290 J/g.

The composition cured initially after about 5 minutes at a temperature of 120° C.

The combination of rapid cure at low temperature and outstanding work-temperature stability, pot life at room temperature being greater than one week, compares quite favorably to current underfill sealant materials now available commercially, but without an exotherm above 300 J/g.

Dropping and Thermal Cycling Tests

The composition was exposed to a heat, shock test while maintaining the replicates at a temperature of about −55° C. for a period of time of about 10 minutes and thereafter an elevation of temperature to about +125° C. for a period of time of about 10 minutes. After a predetermined number of thermal cycles were reached, the replicates were subjected to a continuity test to confirm the electrical connection between the CSP and the circuit board. The replicates were regarded as acceptable when continuity was confirmed to be at least 1000 cycles.

Repair

Using a hot air generator, the area around the CSP fixed to the circuit board with the thermosetting resin composition as described above was heated by applying hot air at 285° C. for 30 seconds. Then, the CSP could be easily removed by inserting a metal piece between the CSP and the glass-reinforced epoxy board, and lifting the CSP.

The full scope of the invention is measured by the claims.

What is claimed is:

1. A method of providing an underfill sealant between a semiconductor device or a semiconductor chip and a circuit board to which said semiconductor device or said semiconductor chip is electrically connected, and subsequently reacting said underfill sealant, reworking said underfill sealant, and removing said semiconductor device or said semiconductor chip from said circuit board after said semiconductor device or said semiconductor chip has failed, the steps of which comprise:
    (a) dispensing said underfill sealant between said semiconductor device or said semiconductor chip and said circuit board;
    (b) exposing said underfill sealant, as so dispensed, to a temperature of from about 80° C. to about 150° C. for a period of time of from about 5 minutes to about 60 minutes to cause said underfill sealant to form a reaction product;
    (c) discovering a failure with said semiconductor device or said semiconductor chip;
    (d) softening said reaction product by heating at a temperature of from about 190° C. to about 290° C. for a period of time of from about 10 seconds to about 60 seconds; and
    (e) removing said semiconductor device or said semiconductor chip from said circuit board by inserting a metal piece between said semiconductor device or said semiconductor chip and said circuit board while said reaction product is soft and lifting said semiconductor device or said semiconductor chip from said circuit board;
    wherein said semiconductor device includes a semiconductor chip mounted on a carrier substrate;
    wherein said underfill sealant, as so dispensed, is thermosetting resin composition comprising:
    (1) an epoxy resin component comprising a combination of a first bisphenol epoxy resin, a second bisphenol epoxy resin different from said first bisphenol epoxy resin, and a cycloaliphatic epoxy resin;
    (2) an inorganic filler component having a mean particle size distribution of about 1 to about 1,000 nm; and
    (3) a thermal initiator capable of liberating a cationic catalyst; and
    wherein said thermosetting resin composition exhibits an exotherm of less than 300 J/g when exposed to a temperature of from about 80° C. to about 150° C. for a period of time of from about 5 minutes to about 60 minutes.

* * * * *